Sept. 9, 1969 F. HUGLE ET AL 3,465,874

CARRIER FOR SEMICONDUCTOR DEVICES

Filed June 12, 1967 2 Sheets-Sheet 1

INVENTOR.

BY Francis Hugle

William Perrine

Sept. 9, 1969 F. HUGLE ET AL 3,465,874
CARRIER FOR SEMICONDUCTOR DEVICES
Filed June 12, 1967 2 Sheets-Sheet 2

INVENTOR.
Frances Hugle
BY
William Currine

United States Patent Office 3,465,874

Patented Sept. 9, 1969

3,465,874

CARRIER FOR SEMICONDUCTOR DEVICES

Frances Hugle, Santa Clara, and William Perrine, Sunnyvale, Calif.; said Hugle assignor to Frances Hugle as trustee of Frances Hugle Trust Filed June 12, 1967, Ser. No. 645,459

Int. Cl. B65d *83/00*

U.S. Cl. 206—56 3 Claims

ABSTRACT OF THE DISCLOSURE

A flexible strip has a centrally disposed row of uniformly spaced depressions of essentially square or inverted truncated pyramidal shape; also a row of indexing holes adjacent to each edge of the strip for moving the same and for providing an index of position for testing a semiconductor chip residing in an adjacent depression. Additionally, a cover strip may be employed for shipping or storing, in which case the flexible strip has a row of bumps adjacent to each edge and the cover strip has a row of holes mating with the bumps for detachably fastening the two strips together.

This invention relates to a carrier for semiconductor devices which permits the individual devices to be stored and shipped in fixed positions within the carrier while being protected from dirt and mechanical damage.

The term "semiconductor device," as used here includes, but is not limited to diodes, transistors, controlled rectifiers, and integrated circuits. It refers to these devices before they have been packaged or attached to another structure. Such unpackaged semiconductor devices are frequently called "chips," "die" or "dice." They vary greatly in size, from .010" x .010" to almost a square inch, but the smaller they are, the more difficult the handling problems. The smaller devices are normally manufactured in an array of up to several thousand similar devices in one slice of semiconductor matreial. Handling of the devices is cheap and efficient until they are separated by one of the various techniques for "dicing." The top of the die usually has a thin film of aluminum or other soft metal over part of its surface. If the dice are permitted to randomly bounce against each other, the metal film is frequently damaged and the damaged devices must be scrapped, as repair is not usually possible.

The device must be moved from where they are separated to where they will be attached to substrates and/or packaged, in one of the many machines that perform the "die attach" operation. This may be across the room or half way around the world. Either way, they must be carried on or in something. Also, between dicing and packaging they must be stored for times varying from a few minutes to several months. High level symmetry within the chips is the exception rather than the rule. The dice not only have a front side and a back, but a top and a bottom, left and right. Before they can be put into a package or onto a substrate, they must be properly oriented.

It is an object of this invention to provide a carrier for semiconductor devices which keeps them separated from one another.

It is a further object of this invention to provide a carrier for semiconductor devices which will maintain their position and orientation during shipping and storage.

It is a further object of this invention to provide a carrier which protects all sides of the devices.

It is a further object of this invention to provide a carrier which can be used to present the devices to an automatic die attach machine without any intermediate handling.

These and other objects and advantages of this invention will be readily appreciated as the same becomes understood by reference to the following detailed description when considered in connection with the accompanying drawings.

Figure 1:
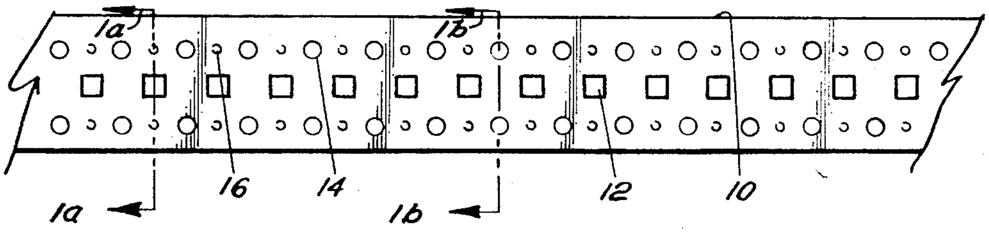
Figure 2:
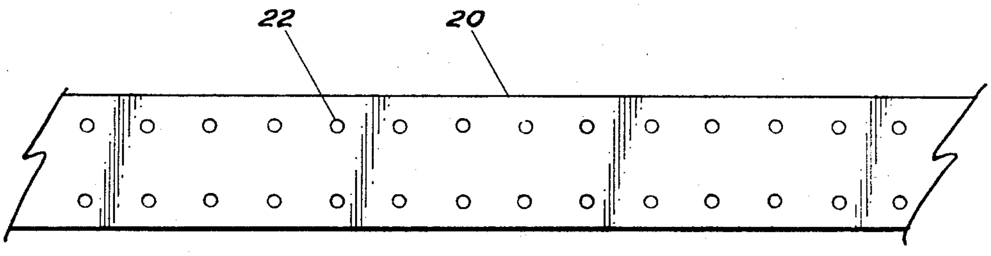

FIGURE 1 shows a top view of the carrier 10 which is a long narrow ribbon of metal, plastic, or other suitable material sufficiently thin and flexible to be rolled onto a spool or reel of reasonable diameter. In the center is a row of depressions 12 to hold the chips regularly spaced. Toward the edges are holes 14, also regularly spaced to permit a simple sprocket mechanism to move the ribbon 10 in a precise and controllable manner. Also spaced along the carrier are bumps 16 which engage holes 22 in the cover 20. FIGURE 2 shows the cover. The pumps 16 are sized and shaped to make a snap fit with the holes 22. cover 20. FIGURE 2 shows the cover. The pumps 16 are sized and shaped to make a snap fit with the holes 22. Alternatively, the bumps 16 could be on the cover 20 and the holes 22, or depressions, in the carrier 10. The cover 20 may also be metal, plastic, or other suitable material that can be rolled onto the spool or reel when snapped in place on the carrier 10.

Figure 1A:
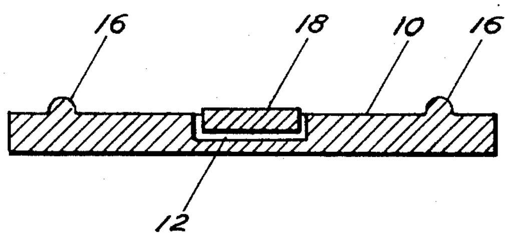

FIGURE 1*a* shows a section through the carrier 10 with a semiconductor chip 18 in the depression 12. FIGURE 1*a* also shows the bumps 16, which are not necessarily in line with the depression 12.

Figure 1B:
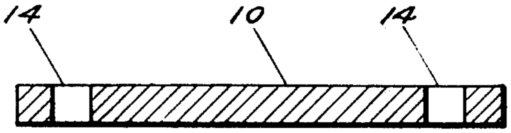

FIGURE 1*b* shows another section of the carrier 10 through the indexing holes 14.

Figures 3, 3A:
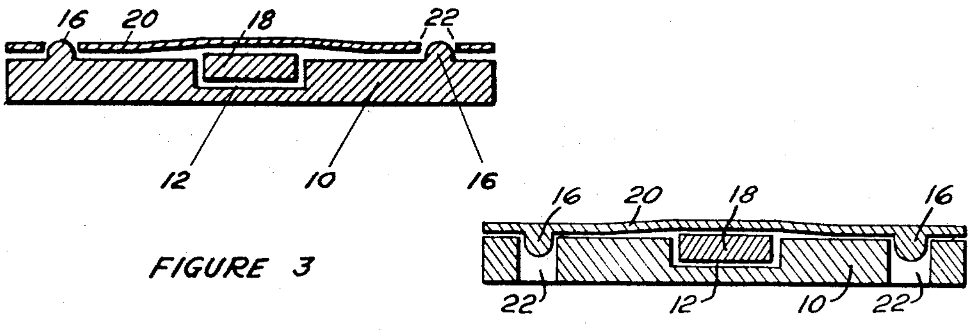

FIGURE 3 shows a section through the carrier 10 with the die 18 in the depression 12 and the cover 20 snapped in place over the bumps 16.

FIGURE 3*a* shows the same as FIGURE 3, except that the bumps 16 are a part of the cover 20 and the matching holes 22 are in the carrier 10.

In FIGURES 1, 1*a*, and 3 the depression 12 has rectilinear sides. The larger the depression 12 with respect to the die 18 the easier it is to load the carrier but the die is held less rigidly oriented. A good ratio of depression 12 edge length to die 18 edge length is from 1.1:1 to 1.3:1. A ratio of 1.3 to 1 limits rotation of the die 18 within the depression 12 to ±22°. A ratio of 1.15 to 1 limits the rotation of the die to ±10°.

Figure 4:
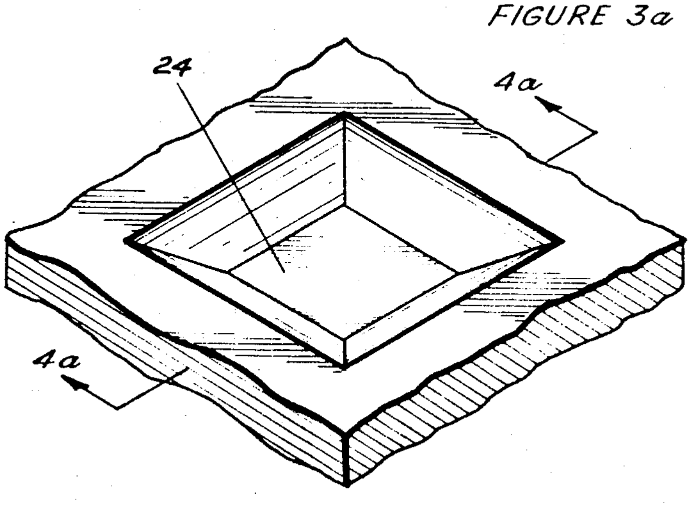
Figure 4A:
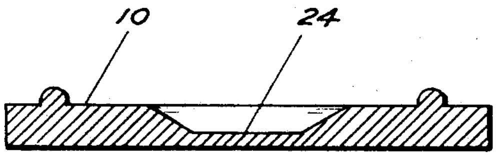

FIGURES 4 and 4*a* show an alternate depression shape 24 to facilitate loading and maintain die orientation. The shape of the depression 24 is an inverted truncated pyramid. This is especially successful in maintaining orientation if the top of the semiconductor 18 is above the upper surface of the carrier 10 so that the cover 20 exerts pressure on the chip.

There are many ways of making the carrier, such as stamping or molding and some of these would naturally result in a bottom contour which follows the top contour. The bottom contour is not necessarily significant to this invention.

This carrier is extremely economical of space. A 12 foot carrier .200 inch wide with a one foot leader, one foot follower, and 10 feet of working length easily stores 1,200 .040" x .040" dice on a spool a quarter inch wide and 2 inches in diameter. If the carrier 10 is formed of a material which is transparent to infra-red, the devices can be positioned for flip-chip bonding while in the carrier, using infra-red optics. Devices for flip-chip bonding would be loaded into the carrier face down.

Having thus described the invention, what is claimed is:

1. A carrier-semiconductor chip assembly comprising;

(a) a plurality of rectilinear semiconductor chips (18), (b) an elongated flexible strip (10) having, (1) a single centrally disposed row of uniformly formed and spaced rectilinear depressions (12 or 24) having a depth less than the thickness of said chips and aligned to retain each of said chips in substantially the same alignment with respect to an edge of said strip, (2) a row of indexing holes (14) adjacent to each edge of said strip having a fixed linear relation to said depressions, (3) a row of bumps (16) colinearly and alternately disposed with respect to said row of indexing holes, and (c) an elongated flexible cover strip (20) having (1) a row of holes (22) adjacent to each edge of said cover strip spaced to receive said bumps (16), whereby said cover strip (20) exerts pressure upon said chips to retain the chips in place.

2. The carrier chip assembly of claim 1 in which;

(a) the surfaces (24) of said depressions have the shape of the surfaces of an inverted truncated pyramid, whereby chips of slightly different dimensions are retained at a selected orientation with respect to the edge of said strip.

3. The carrier chip assembly of claim 1 in which;

(a) said row of holes (22) is formed in said elongated flexible strip (10), and (b) said row of bumps (16) is formed in said cover strip (20).

References Cited

UNITED STATES PATENTS

| | | | |
|---|---|---|---|
| 3,279,148 | 10/1966 | Henn. | |
| 3,394,679 | 7/1968 | Bentley | 198—131 X |
| 3,204,329 | 9/1965 | Sweeney | 206—65 X |
| 3,311,229 | 3/1967 | Troll et al. | 206—56 |
| 3,312,453 | 4/1967 | Willard et al. | 206—56 X |
| 3,331,497 | 7/1967 | Lunsford | 206—56 |
| 3,335,852 | 8/1967 | Soma | 206—56 |

MARTHA L. RICE, Primary Examiner

U.S. Cl. X.R.

198—131